United States Patent [19]

Bamji et al.

[11] Patent Number: 5,381,343
[45] Date of Patent: Jan. 10, 1995

[54] HIERARCHICAL PITCHMAKING COMPACTION METHOD AND SYSTEM FOR INTEGRATED CIRCUIT DESIGN

[75] Inventors: Cyrus Bamji; Ravi Varadarajan, both of Fremont, Calif.

[73] Assignee: Cadence Design Systems, Inc.

[21] Appl. No.: 889,831

[22] Filed: May 26, 1992

[51] Int. Cl.$^6$ ............................................. G06F 15/60
[52] U.S. Cl. .................................. 364/488; 364/489; 364/491
[58] Field of Search ................ 364/488, 489, 490, 491

[56] References Cited

U.S. PATENT DOCUMENTS 5,079,717  1/1992  Miwa ................................... 364/490
5,281,558  1/1994  Bamji et al. ........................ 437/250

OTHER PUBLICATIONS

David G. Boyer, "Symbolic Layout Compaction Review", ACM IEEE 25th Design Automation Conference, 1988; paper 26.1, pp. 383–389.
David Marple, "A Hierarchy Preserving Hierarchical Compactor", ACM IEEE 27th Design Automation Conference, 1990; paper 22.2, pp. 375–381.
David Marple, "Globally Optimum Compaction of Layout Hierarchies", 1990 preprint of document AB supra.
Cyrus S. Bamji, Charles E. Hauck, and Jonathan Allen, "A Design By Example Regular Structure Generator", ACM IEEE 22nd Design Automation Conference, 1985; paper 2.3, pp. 16–21.
John Hopcroft and Robert Tarjan, "Efficient Planarity Testing", Journal of the ACM, vol. 21, No. 4, Oct. 1974, pp. 549–568.
Jurgen Doenhardt and Thomas Lengauer, "Algorithmic Aspects of One-Dimensional Layout Compaction", IEEE Transactions on Computer-Aided Design, vol. CAD-6, No. 5, Sep. 1987, pp. 863–878.
Chi-Yuan Lo and Ravi Varadarajan, "An $O(n^{1.5}\log n)$ 1-d Compaction Algorithm", ACM IEEE 27th Design Automation Conference, 1990, pp. 382–386.
Debaprosad Dutt and Chi-Yuan Lo, "On Minimal Closure Constraint Generation for Symbolic Cell Assembly", ACM IEEE 28th Design Automation Conference, 1991, paper 41.5, pp. 736–739.
Yuh-Zen Liao and C. K. Wong, "An Algorithm to Compact A VLSI Symbolic Layout With Mixed Constraints", IEEE Transactions on Computer-Aided Design, vol. CAD-2, No. 2, Apr., 1983, pp. 62–69.
Mark Reichelt and Wayne Wolf, "An Improved Cell Model for Hierarchical Constraint-Graph Compaction", IEEE Int'l. Conf. on Computer-Aided Design, 1986; pp. 482–485.
Christos H. Papadimitriou and Kenneth Steiglitz, "Combinatorial Optimization: Algorithms and Complexity"; Prentice-Hall, Englewood Cliffs 1982, pp. 1–3, 26–66, 88–103, 342–343.
"Physical Design Automation of VLSI Systems", Ed. by B. T. Preas and Michael J. Lorenzetti, Benjamin/Cummings, Menlo Park 1988; Ch. 6, pp. 211–267, 274–281.

*Primary Examiner*—Kevin J. Teska
*Assistant Examiner*—Susan Wieland
*Attorney, Agent, or Firm*—Fenwick & West

[57] ABSTRACT

A hierarchical pitchmatching compactor is provided that maintains hierarchical structure, design rule correctness, and circuit integrity of a symbolic layout while globally compacting the layout without excessive computational or data handling requirements, even for layouts of substantial size. The compactor achieves this result by taking advantage of the regularity of the layout, to reduce the number of constraints in the linear programming problem to a minimum level. This minimal problem, called the minimum design, can be drastically smaller than the original minimization problem for layouts of practical interest. This technique is implemented by means of a computer program that operates on the original symbolic layout of an integrated circuit to produce an automatically compacted layout as the data output.

6 Claims, 7 Drawing Sheets

Level 1

Level 2

Level 3

Level 4

Chip

HIERARCHICAL PITCHMAKING COMPACTION METHOD AND SYSTEM FOR INTEGRATED CIRCUIT DESIGN

BACKGROUND OF THE INVENTION

1. Field of the Invention

This invention pertains generally to the field of automated design techniques for electronic circuits, and more particularly to compaction and pitchmatching methods for hierarchically defined layouts of integrated circuits, and systems for implementing these methods.

2. Description of the Background Art

The complete design of an integrated circuit can be a very laborious and time-consuming process, and for many chips of practical interest the physical design of the electronic circuit is far too complex to be carried out without the aid of computers and sophisticated design tools. Since the advent of VLSI circuit technology this field of design automation has grown rapidly, and is becoming a mature technology in itself. There are now a variety of techniques available to aid the designer, and a substantial number of computer programs have been written to implement these techniques.

The physical design of an integrated circuit can be carried out in terms of the symbolic layout of the circuit, rather than the actual geometry of the masks and lavers that comprise the chip. The designer can thus work with transistors, wires, and other primitive components, and groups of these components termed "cells", represented by various symbols. The symbolic layout provides a higher level of abstraction than the mask layout, and is therefore easier for the designer to manipulate. The layout of these symbols can then be translated into a mask layout suitable for the actual fabrication of the chip. This translation requires additional technical information regarding the fabrication technology, which is stored in a "technology database" and used when the translation is carried out.

A symbolic layout that contains only primitive symbols—i.e. transistors, wires, capacitors and other physical components—is termed a "leaf cell". Many layouts contain a large number of groups of components that are substantially identical. Such a group may be used to define a cell, and the description of the layout may then be simplified by treating each such group as an instance of this cell. The cell has its own symbol; for example it may be represented as a rectangle with various ports for connecting wires or for abutment with ports of adjacent cells that are represented similarly. The components of the overall layout then may consist of cells, and the layout represents their relative placement and interconnection. By describing the layout in terms of cells rather than primitive symbols, again the designer's task is made much simpler.

Similarly, a given layout of cells may contain a large number of groups of cells, or cells and other components, in which the groups are identical. Such a group of cells may be used to define a "supercell", and the layout may again be simplified by treating each such group of cells as an instance of the supercell. Again, this supercell has its own symbol and ports, and the overall layout is a representation of the arrangement and interconnection of these supercells.

Obviously this process may be repeated, so that a symbolic layout can be treated as a hierarchical structure with multiple levels. Each level is a symbolic layout of various cells and primitive components. Each such cell is in turn a symbolic layout of subcells and primitive components, and this layout defines the next lower level of the hierarchy. Since there may be more than one type of cell at any given level, the next lower level may contain several different branches. The cells at the lowest level are leaf cells since they contain no subcells, but only primitive components. Therefore the hierarchy can be visualized as an inverted "tree" with branches extending downward, and the lowest level depends on the branch in which it is located. In short, the leaf cells are located at the ends of the branches, and the trunk of the tree represents the symbolic layout of the whole chip, which is often termed the "root cell". This hierarchical description is a natural and concise representation for large designs.

The task of integrated circuit design generally includes optimization of one or more parameters of the circuit. The designer usually attempts to minimize the geometrical size of the overall structure. This minimization is subject to several constraints that ensure that the technical design rules are followed and the integrity of the circuit is maintained. For example certain components of the circuit must be separated by a minimum distance, and the connections between different components must be maintained. The automated process of size minimization is known as compaction. The compactor is a computer program that operates on a symbolic layout that constitutes the input data and produces a new symbolic layout. This new layout corresponds to the design of the minimum size circuit that preserves the integrity of the original circuit and complies with the design rule requirements.

Compaction of leaf cells is a process that has been studied extensively. Compaction techniques for leaf cells have been summarized in the article by David G. Boyer entitled "Symbolic Layout Compaction Review", given at the ACM IEEE 25th Design Automation Conference, 1988, paper 26.1. Some researchers have attempted to use leaf cell compactors on hierarchical symbolic layouts. For example, obviously one can "flatten" a given hierarchical layout into a leaf cell and then use a leaf cell compactor. This method would give a layout of absolute minimum size. However, such a brute force method has the drawback that the size of the database for the compacted output layout becomes enormous and the compaction process becomes prohibitively expensive even for layouts of moderate size. Furthermore the characterization and modification of the output layout is more difficult because the input hierarchy is lost in the compaction process.

Another approach to hierarchical compaction is the "bottom-up" technique, in which leaf cell compaction is applied level by level starting from the leaf cells and working upward. During compaction of each level of the hierarchy the cells and subcells are assumed to be rigid objects. Once a given level is compacted, the connectivity or port abutment between cells at the next higher level is generally destroyed and must be re-established before the next level can be compacted. This degradation of cell connectivity is a serious drawback in designs with cells that are largely connected by abutment.

A further approach is to de-couple the cell abutment and compaction problems. One simply fixes the port positions of leaf cells without taking into account the design constraints within these cells. One then applies a leaf cell compactor to these leaf cells with fixed port positions. A similar process is carried out at higher levels. This technique can lead to infeasible designs since the fixing of port positions may produce an over constrained compaction problem. Such a methodology is often a time-consuming trial and error process, and the resulting solution is usually sub-optimal.

A recent attack on the hierarchical compaction problem has been described in the paper by David Marpie entitled "A Hierarchy Preserving Hierarchical Compactor", published in ACM IEEE 27th Design Automation Conference, 1990, pp. 134–140. This technique simultaneously carries out leaf cell compaction and maintains the port connectivity between abutting cells, (termed "pitchmatching"), while preserving the hierarchical structure. In this method, the global compaction problem is formulated as a linear programming problem, which is solved by the "Revised Simplex Method". The number of variables and constraints that must be handled grows with the size of the hierarchy, and the computation time increases rapidly with the hierarchy size. Hence, the complexity of the overall method is significant and the size of the layout that can be dealt with is limited.

In short, the definition of hierarchical compaction in the truest sense is the minimizing of the area of the hierarchically defined symbolic layout while preserving the hierarchical structure, design rule compliance, and electrical connectivity between components and cells. For cells connected by abutment in the input layout, the connection must be maintained in the compacted layout; i.e. the compactor must include pitchmatching. The entire process must be handled globally; all constraints throughout the layout must be treated simultaneously. Prior to the present invention, no satisfactory techniques have been available for carrying out this compaction for large-sized layouts.

SUMMARY OF THE PRESENT INVENTION

The present invention is a hierarchical compactor which maintains hierarchical structure, design rule correctness, and pitchmatching. This hierarchical compactor can handle very large designs by reducing the linear programming problem to its minimal size. This reduction is accomplished by taking advantage of the redundancies in the original problem to transform the original layout hierarchy to a reduced representation, termed the "minimum design", which captures all the necessary features of the input layout. The reduction is effected by breaking the original problem, specifically the relationships describing the constraints, into three classes, namely (A) intracell constraints, (B) intercell constraints, and (C) loop constraints. In each of these classes of constraints the minimum set of relationships which carries all the information in that class is identified. This minimum set of constraint relationships is the set that corresponds to the minimum design. Compaction is carried out with this minimum set, and then the results are transformed back to obtain the compacted version of the original layout.

This method is a distinct improvement in that the original linear programming problem is vastly reduced by the transformation to the minimum design problem. The compaction of this minimum design can be carried out with much less computational time, and depending on the amount of regularity in the original layout the amount of data involved can be far smaller than the compaction of the original layout. This method is guaranteed to find the optimal solution of the compaction problem subject to the exact preservation of the hierarchical structure, and it is computationally feasible for large layouts.

The method is carried out by means of a computer program. The symbolic layout is represented in numerical form, and the representation contains all the information necessary to specify the hierarchical structure, cell definitions and locations, positions of components and electrical interconnections. The output of the program is the numerical representation for the compacted layout.

DETAILED DESCRIPTION OF THE PREFERRED EMBODIMENT

Figure 1:
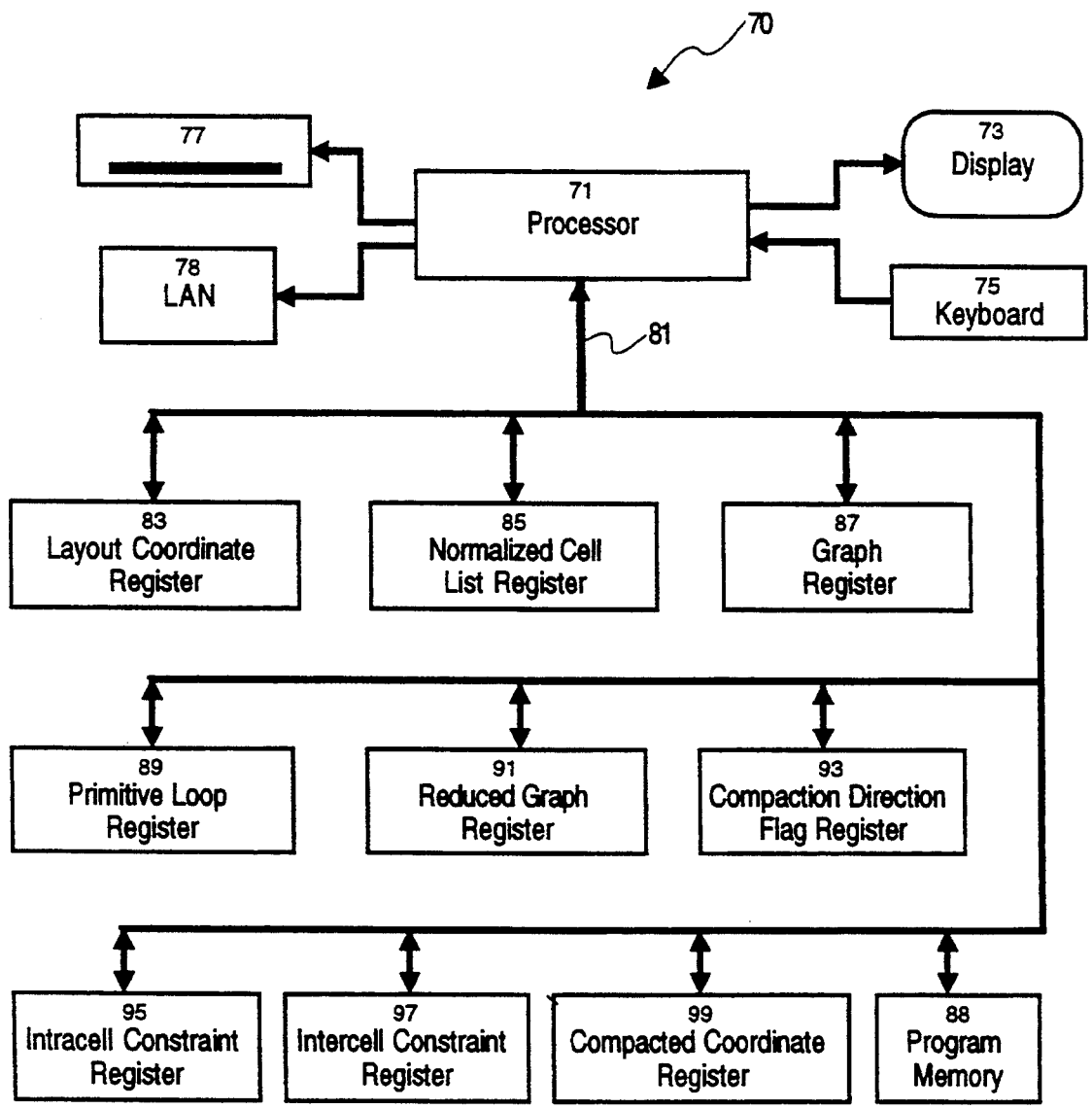
FIG. 1 is a block diagram showing compaction system (70) of the present invention.

Referring now to FIG. 1, a block diagram of compaction system 70 of the present invention is shown. The preferred embodiment is implemented on a general purpose computer such as a Sun Microsystems, Inc. workstation. Utilizing dedicated software, the general purpose computer specifically configures memory and system peripherals for the purpose of executing steps of this preferred method. Compaction system 70 comprises processor 71, display 73, keyboard 75, printer 77, program memory 88, and local area network 78. Processor 71 executes instruction steps stored in program memory 88, while keyboard 75 and display 73 provide a user interface to processor 71. Printer 77 generates a permanent record of the compaction of the present invention, and local area network 78 enables processor 71 to communicate and exchange information with external computers and compaction systems. Not shown in FIG. 1, but useful as an alternative embodiment, is a digitizing table for identifying and generating coordinates and integrated circuit (IC) layouts. Processor 71 is connected to various memories and storage devices through data bus 81. Connected to data bus 81 are layout coordinate register 83, normalized cell list register 85, graph register 87, primitive loop register 89, reduced graph register 91, compaction direction flag register 93, intracell constraint register 95, intercell constraint register 97, and compacted coordinate register 99.

Layout coordinate register 83 stores data relating to layout coordinates of the target IC or integrated circuit board to be compacted. In the discussion that follows the compaction system and method will be directed to the reduction of geometrical areas of an integrated circuit (IC) layout. It should be noted, however, that this method and system find useful application in the compaction of circuit board layouts as well. When creating mask works for integrated circuits, designers typically begin with a circuit schematic consisting of an interconnected network of logic or circuit elements. The designer generally has available a library of mask work patterns or cells which correspond to the various circuit element used in the design. Creating a mask work then consists of transforming the circuit schematic by substituting various library patterns for the schematic circuit elements in such a way as to provide efficient use of available mask area. The compaction process of the present invention is directed to the reduction of the geometries of this mask area. Elements in each of these cells have coordinate attributes as well as a variety of design rules which govern the location and relative placement of components and features within each of these cells. These rules are also referred to as constraints. A typical constraint might reflect the minimum allowable distance from which a ground line may be placed next to a power bus, in order to avoid a short circuit over the range of processing tolerances.

Normalized cell list register 85 stores coordinates which result from the normalization of the layout as described in the steps below. Following the substitution of library cells for schematic elements, the new layout representation, which comprises this collection of abutting cells, is transformed into a graph representation referred to as an interface graph. This interface graph provides a useful model within which the cell geometries may be more easily reduced. The coordinates and related data which describe this graph representation are stored in graph register 87. Primitive loop register 89 stores data relating to the relative distances between the various cells described. A useful feature of "graphing" the cell relationships (creating graph representations of the cell) within the IC layout, is that certain redundancies can be identified and easily eliminated. Following this elimination of redundancies, the remaining circuit layout is stored in reduced graph register 91.

Subsequent to graph reduction, a compaction process is employed which can be operated in either the x-direction or the y-direction of the two-dimensional IC layout. This direction is chosen more or less randomly and is stored in compaction direction flag register 93. Intracell constraint register 95 stores a list of design rules which must be internally maintained when using the cell in a larger structure. Examples of these rules include minimum distances between metal lines and minimum widths of the various power and ground traces. Intercell constraint register 97 contains a set of constraints or rules which define the relationships which must be maintained between two interacting cells. Compacted coordinate register 99 stores the coordinates of the reduced IC layout following compaction, and is used in the generation of the finished mask work.

Figure 2A:
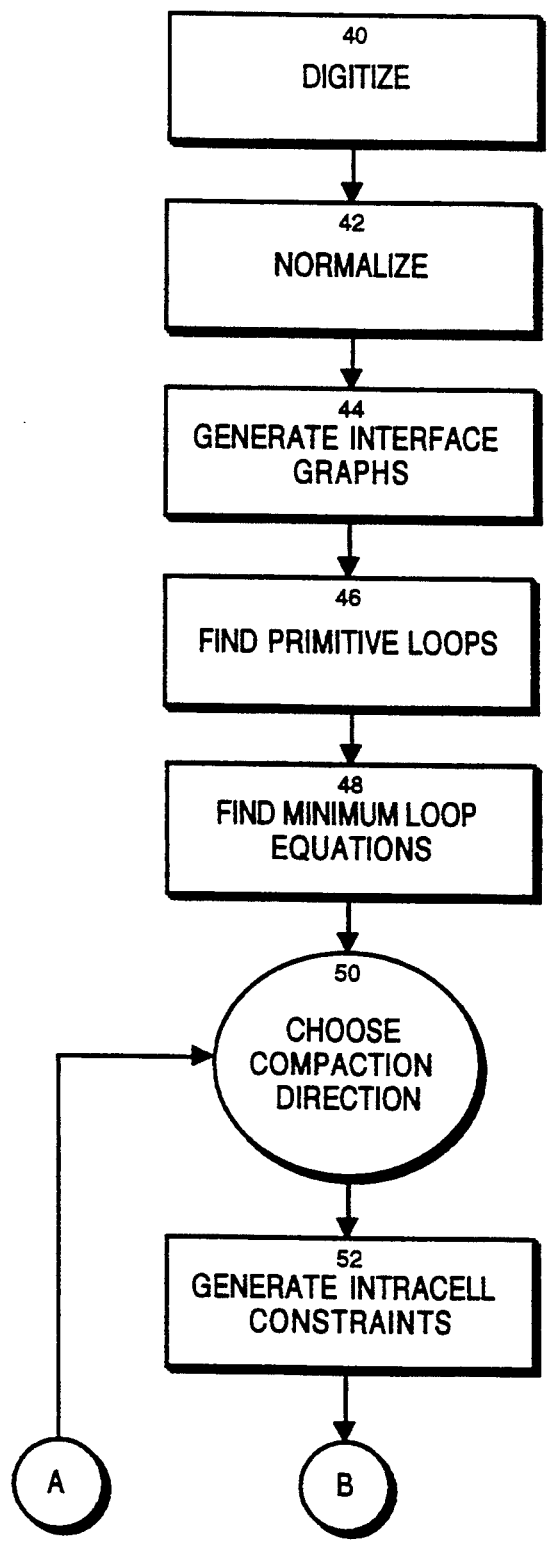
FIG. 2(a)–(b) is a flow diagram illustrating the method of the present invention.
Figure 2B:
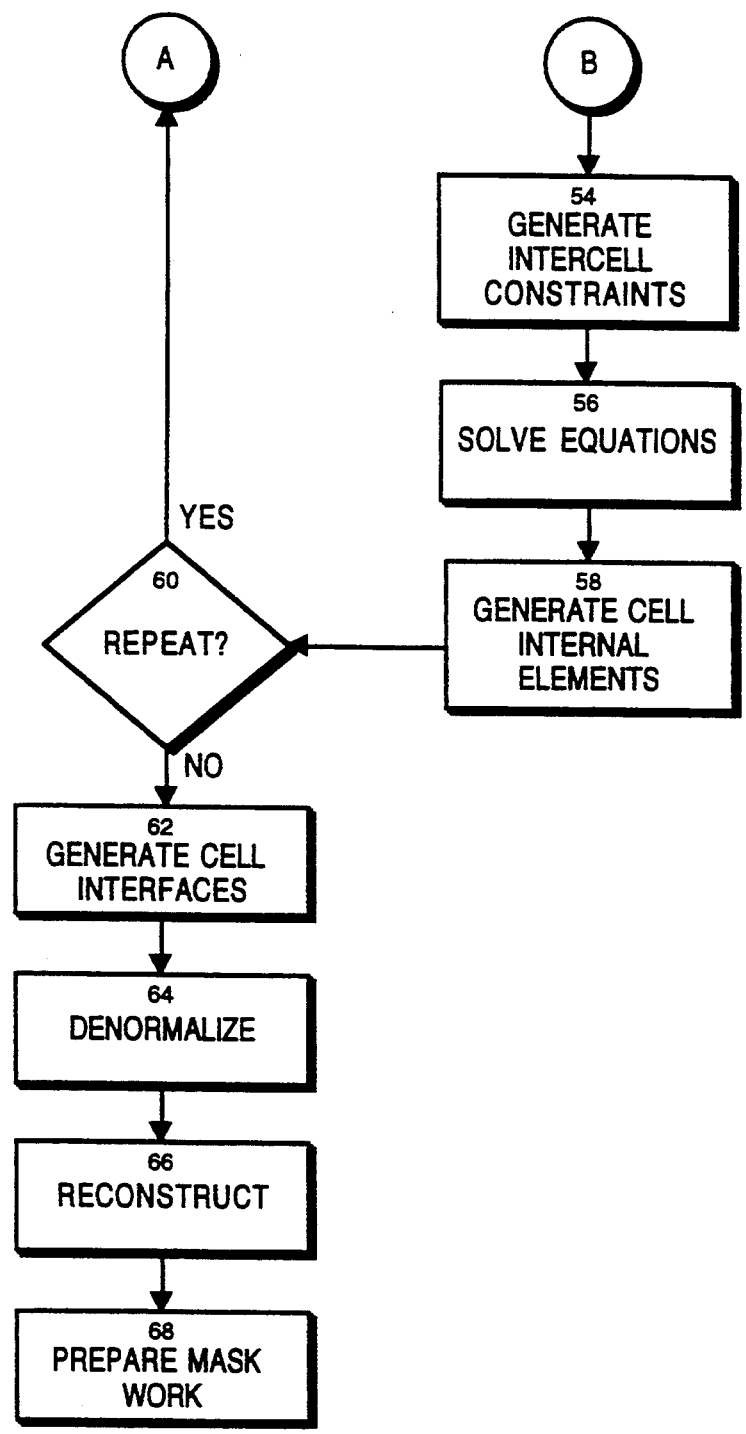
Figure 3A:
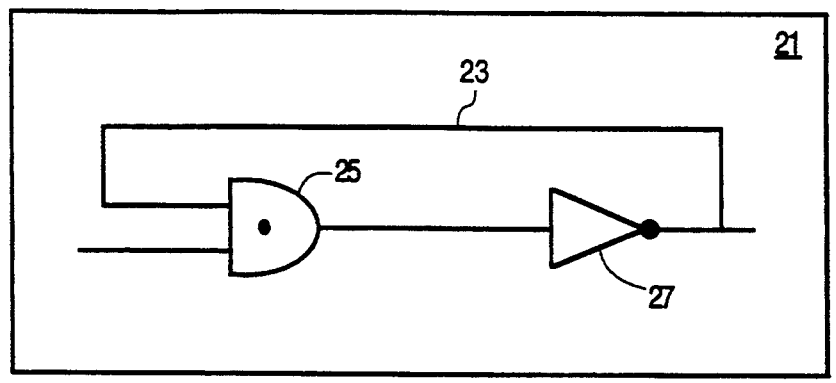
FIG. 3(a) is a typical circuit schematic diagram having a layout representation which would be compacted using the present invention.

A flow diagram outlining the compaction process of the present invention is shown in FIG. 2. As described above, the purpose of this compaction process is to reduce the physical geometric surface area required for the implementation of a given electronic circuit by a mask work. A portion of a typical circuit schematic, the layout representation of which would be compacted using this method and system, is shown in FIG. 3(a). In the sample circuit, two elements are shown: an inverter 27, and a two-input AND gate 25 having its output connected to the inverter 27. The output of inverter 27 feeds back along path 23 and comprises one of the two inputs to AND gate 25. An integrated circuit mask work layout of this sample schematic 21 would be created using library cells which execute the functions of the individual circuit elements 25, 27. An example of this layout implementation is shown schematically in FIG. 3(b) where AND gate 25 is substituted by an AND gate functional layout 29 (represented by the box surrounding the circuit element). Inverter 27 likewise is represented by an equivalent layout 31.

The first step 40 of the process shown in FIG. 2 involves annotating the layout so that the various cells and components can be easily manipulated by a computer. This annotation consists of a coordinate representation which describes the relative location of each cell and component with respect to others in the layout. This annotation is either directly available within cells of a cell library, or may be created for non-library cells by digitizing artwork of the non-library cell layout. The various coordinate data is stored by processor 71 in layout coordinate register 83.

Figure 3B:
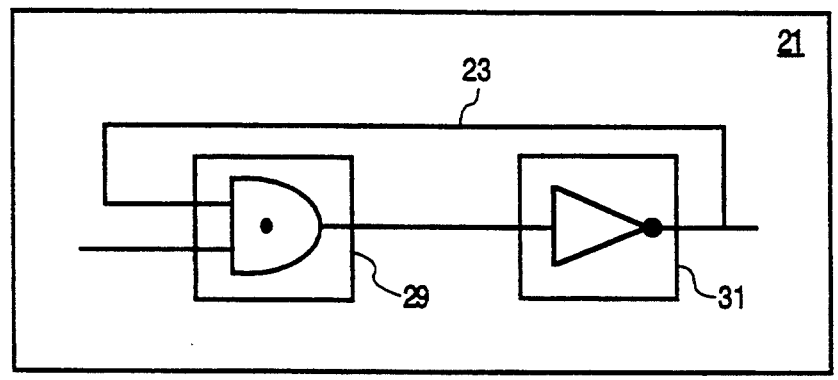
FIG. 3(b) is a functional schematic representation of the cell layout of FIG. 3(a)
Figure 3C:
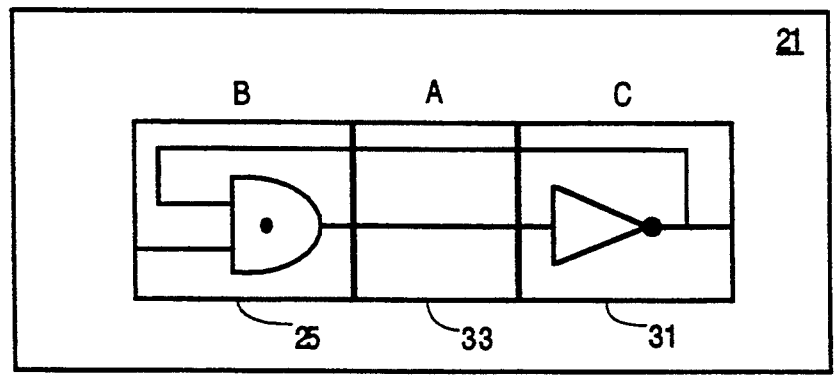
FIG. 3(c) is a functional representation of FIG. 3(b) following normalization.

The circuit shown in FIG. 3(b) is often referred to as a higher level hierarchical cell since each of the elements represented by circuit components within the layout may actually have one or more subcells comprising them. In addition, although AND gate 29 and inverter 31 are each cell components, the various routing elements, such as feedback 23, are not in this representation identified by a separate cell. The purpose of next step 42 is to normalize the overall hierarchical layout structure into a representation in which all cells within the layout abut or connect each other and in which all cells can be treated as being at electrically the same level. In implementing the normalization of step 42, processor 71 redefines each cell of the layout stored in layout coordinate register 83 to be either a pure hierarchy cell containing only instances of other cells, or a pure leaf cell, i.e., containing only primitive components. In addition, all cells are defined such that all interconnections between cells are defined by abutment, that is so that each of the cells have boundaries which are connected directly to other cells. For example, FIG. 3(c) shows the corresponding layout of FIG. 3(b) following normalization in which the routing is also assigned a cell structure 33. In the simple normalized structure of FIG. 3(c), AND gate 25 is connected directly to and abuts routing cell 33, which also directly connects and abuts inverter 31. Each of these cells are treated as being on the same hierarchical level in the normalized layout. The geometrical coordinates of this new normalized layout are stored by processor 71 in normalized cell list register 85.

Figure 4A:
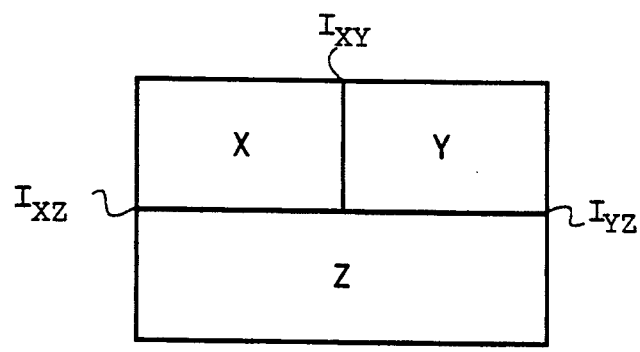
FIG. 4(a) and 4(b) are block representations of cells X, Y, and Z, before and after graphing.
Figure 4B:
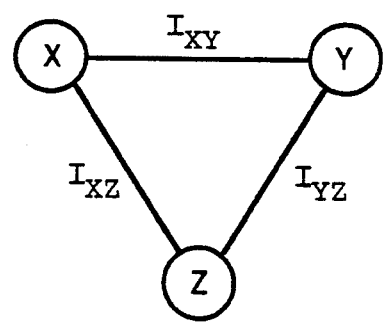

The next step 44 is to generate interface graphs for the normalized layout. This technique is described in an article by C. Bamji, C. Hauck, and J. Allen, entitled "A Design-By-Example Regular Structure Generator" published in ACM IEEE 22nd Design Automation Conference, 1985. An interface graph is a representation of a layout that captures the relative placement of cells in which the vertices represent instances of a cell, and the edges (lines between vertices) represent interfaces which are the legal relative placements between two corresponding cells. The transformation from layout to graph is reversible. This graphing technique is used because it is more amenable to geometrical compaction. The data generated during this graphing transformation are stored by processor 71 in graph register 87. A sample of the graphing technique is shown in FIGS. 4(a) and 4(b). In FIG. 4(a), a block representation of normalized cells X, Y and Z is shown having interfaces $I_{XZ}$, $I_{XY}$, and $I_{YZ}$. FIG. 4(b) shows cells X, Y and Z following graphing. Cell instances X, Y and Z are shown as vertices contained within bubbles, and each cell instance X, Y and Z, is connected by edges labeled $I_{XY}$, $I_{YZ}$, and $I_{XZ}$.

Figure 5:
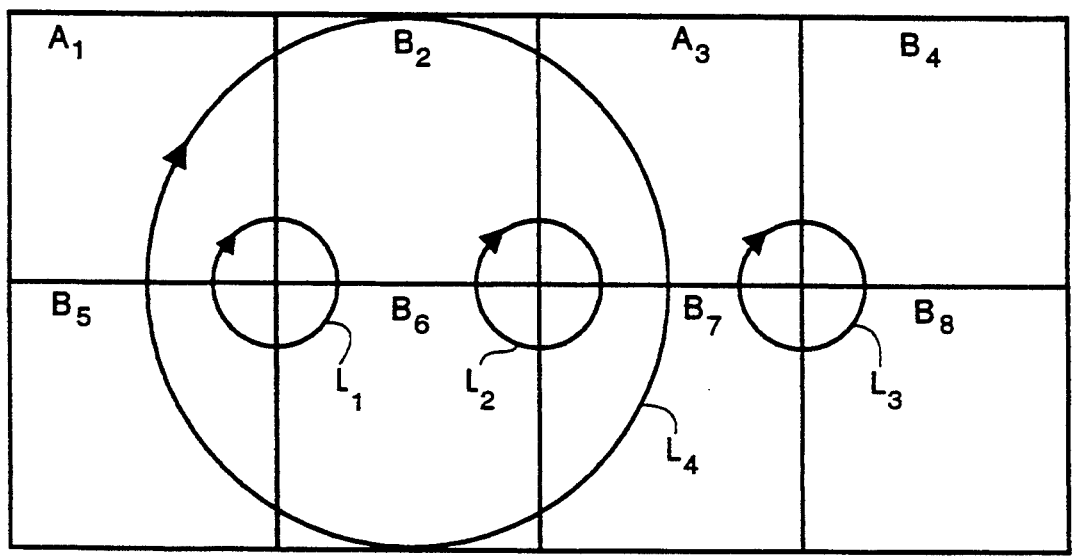
FIG. 5 is a diagram of eight instances of two types of cells, A and B, in a configuration with five different types of interfaces.

The next step in the process is to find primitive loops as indicated in step 46. Each loop defines the relationships between the relative positions of the various nodes of the interface graph. The number of loops in a layout grows very rapidly with the size of the layout. Theoretically a loop equation is required for every loop. However not all of the loops are independent. For example, in FIG. 5 the loop $L_4$ can be derived by adding loops $L_1$, $L_2$. In this Figure it is evident that loops $L_1$, $L_2$, and $L_3$ are independent in the sense that no one loop can be obtained by adding the others. Also, all other loops can be derived as compositions of the "primitive loops" $L_1$, $L_2$, and $L_3$. However, loop $L_3$ also represents the same pattern of cells A and B, as loop $L_1$, and thus gives rise to the same equation. In reducing the problem to be solved by linear programming, it is desirable to find the minimum set of loop constraint equations. The set of all possible loops can be derived from a small set of "primitive loops"; for example, loops $L_1$, $L_2$, $L_3$ are the primitive loops of FIG. 5. The primitive loops are determined by the faces of the interface graph, which can be obtained generally by the algorithm described in tile paper by J. Hopcroft and R. Tarjan entitled "Efficient Planarity Testing", published in the Journal of the ACM, 21-4:549–568, 1974. Once the primitive loops are found, the corresponding loop constraint equations are constructed. In the next step 48, these equations are then subjected to the well-known Schmidt Orthonormalization Method to obtain a complete linearly independent set of loop constraint equations ($L_1$ & $L_2$). This set is the minimum set of equations required to describe all of the loop constraints in the layout. The primitive loop equations are stored in primitive loop register 89, and the set of reduced equations are stored in reduced graph register 91. This construction of the minimum set of loop equations is referred to as "extracting the minimum design."

Step 50 of FIG. 2 involves the choosing of a compaction direction in either the x or y direction in a two-dimensional cartesian layout. In the minimization step 56 discussed below, different compaction results are achieved based on the initial direction of compaction. In step 50 one of the two initial starting directions is chosen. The direction selection is stored by processor 71 in compaction direction flag register 93.

Step 52 involves the generation of intracell constraints and storage of these constraints in intracell constraint register 95. Cells interact with other cells through a small number of objects called ports. The total number of these ports is considerably less than the total number of objects in the cell. The intracell constraints are the constraints between the ports induced by the geometrical spacing constraints between all elements in the cell. Examples of these geometrical spacing constraints include minimum distances between metal lines and the minimum widths of power lines and ground connections. Given port positions satisfying the intracell constraints, it is always possible to find the solutions for internal elements of the cell that satisfy all of the internal constraints. Following the generation of intracell constraints, intercell constraints are generated in step 54 and stored in intercell constraint register 97. For every distinct interface, a set of intercell constraints is generated to preserve abutment and design rule enforcement across cell boundaries. Many interfaces correspond to equivalent pairs of cell instances in the same configuration. All of these equivalent pairs are forced to have the same interface constraints, and therefore the number of intercell constraints is proportional to the number of distinct interfaces, which is small.

In minimization step 56, the total area of the interface graph is minimized by simultaneously solving the intracell, intercell constraints as well as the minimum loop constraints. Finding the minimum area solution of these constraints is most easily carried out using known techniques of linear algebra, such as the Revised Simplex Method. Once the linear optimization problem is solved, the next step 58 involves generation of internal cell elements conforming to the values of the port positions derived by linear programming as mentioned above. Because the port positions satisfy the intracell constraints, this operation is always possible and is carried out using known graph techniques.

Following the generation of cell internal elements in step 58, decision block 60 is reached in which a determination of whether to repeat the compaction is made. This choice is largely heuristically determined, based on a number of factors such as total overall geometry of the cell and the amount unused space contained within the cell layout following compaction. If compaction is to be repeated, the orthogonal compaction direction is chosen in step 50. Various alternatives for compaction are available. One way is to compact in the X direction, then in the Y direction, and finally again in the X direction ("X—Y—X compaction"). Obviously one could also carry out Y—X—Y compaction. Theoretically this process could be carried further, e.g. X—Y—X—Y—X compaction, and so on. For practical purposes, after the first three compaction passes are carried out, there are no further significant changes in the resulting layout from additional compaction iterations. An overall strategy of compaction is to first perform X—Y compaction to obtain one layout, and then perform Y—X compaction (on the original layout) to obtain a second layout. The two compacted layouts are compared and the one with the smallest physical size is used in generating the mask works.

Once compaction is completed, the next step 62 is to recompute all of the cells and cell interfaces from the compacted interface graphs. This is the reverse of the previous step 44.

Next, the compacted layout is denormalized in step 64. This denormalization is the reverse of the previous normalization of step 42. Step 68 involves the preparation of circuit masks works from the now compacted layout. This mask may be produced by lithography or by a variety of known electrophotographic techniques.

EXAMPLE

Figure 6:
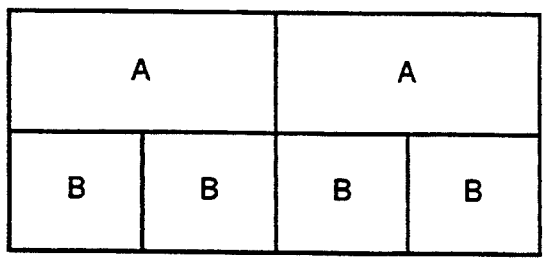
FIG. 6 is a diagram of a hierarchical layout that is built up from two leaf cells, labelled A and B in the Figure, showing 5 levels of hierarchy above the leaf cell structure.
Figure 6:
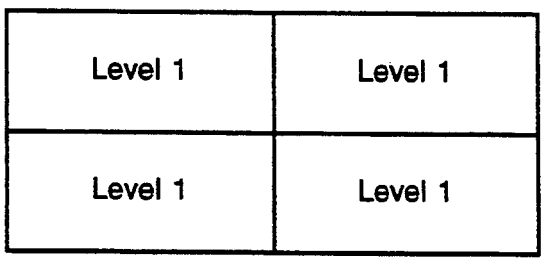
Figure 6:
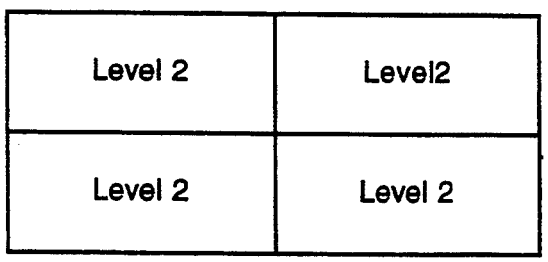
Figure 6:
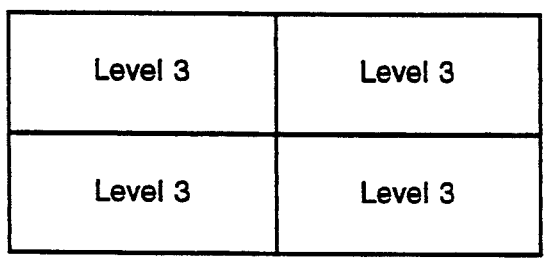
Figure 6:
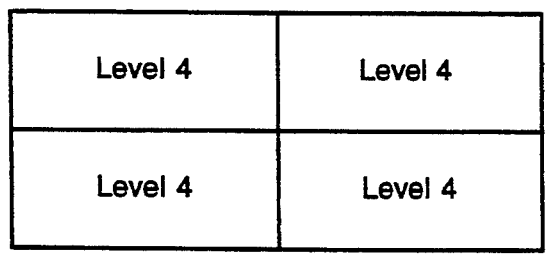

FIG. 6 is a diagram of a hierarchical layout structure built up from two leaf cells, labeled A and B, which contain ports to be abutted. Table 1 shows the number of variables and the number of constraints required at each level of the hierarchy for the present method. Even though the depth of the hierarchy increases and the number of instances explodes, the number of variables and constraints required reach a constant value.

TABLE 1

| Cell | Number of Instances | Present Method | |
|---|---|---|---|
| | | Number of Variables | Number of Constraints |
| Level 1 | 6 | 11 | 13 |
| Level 2 | 24 | 13 | 17 |
| Level 3 | 96 | 13 | 17 |
| Level 4 | 384 | 13 | 17 |
| Chip | 1536 | 13 | 17 |

The foregoing description of the preferred embodiment of the invention is presented only for purposes of illustration and description. It is not intended to be exhaustive or to limit the invention to the precise form disclosed, and obviously many modifications and variations are possible in light of the above teaching. For example, this method and apparatus can be applied to other areas of design automation such as printed circuit board design and circuit verification. This embodiment is chosen and described in order to best explain the principles of the invention and its practical applications to thereby enable others skilled in the art to best utilize the invention in various embodiments and with various modifications as are suitable to the particular use contemplated. It is intended that the spirit and scope of the invention are to be defined by reference to the claims appended hereto.

We claim:

1. A computer implemented method for compacting the geometrical area of an integrated circuit layout including a plurality of cells, each cell including at least one circuit element, each cell interconnected with at least one other cell across an interface, the method comprising the steps of:
   normalizing the circuit layout such that all cell interconnections are defined by abutment with other cells in a single level layout;
   generating interface graphs of the normalized circuit layout, wherein each cell within the circuit layout is represented by a node and relative placements of interconnected cells are represented by edges connecting the nodes representing the cells;
   generating a minimum set of primitive loop constraints, each primitive loop constraint representing a relationship between relative placements of a plurality of nodes of the interface graphs;
   generating a minimum set of intracell constraints, each intracell constraint describing electrical interactions and geometrical spacing relationships between elements within a cell;
   generating a minimum set of intercell constraints, each intercell constraint describing an abutment relationship between cells, for preserving electrical connectivity and design rule enforcement across cell interfaces;
   minimizing the geometrical area of the normalized circuit layout by simultaneously solving the minimum sets of primitive loop, intracell and intercell constraints;
   reconstructing the normalized integrated circuit layout by reversing the generation of the interface graphs using the solutions to the minimum sets of primitive loop, intracell and intercell constraints: and
   denormalizing the reconstructed normalized integrated circuit layout to produce the compacted integrated circuit layout.

2. The method for compacting of claim 1 further comprising a first step of:
   digitizing the integrated circuit layout in order to convert a physical layout to a coordinate layout representation suitable for computer implementation.

3. The method of claim 1 wherein the step of minimizing the geometrical area of the normalized circuit layout is performed using linear programming methods to solve the minimum sets of primitive loop, intracell, and intercell constraints.

4. A compaction system for minimizing the geometrical area of an integrated circuit layout including a plurality of cells, each cell including at least one circuit element, each cell interconnected with at least one other cell across a interface, the system comprising:
   processor means for executing programmed instructions, and for storing and retrieving data;
   program memory means connected to the processor means for storing program instruction steps for execution by the processor means;
   layout coordinate memory means connected to the processor means for storing data relating to layout coordinates of the circuit layout to be compacted, from which the processor means extracts data relating to cell interconnections and relative placements between cells contained in the circuit layout:
   normalized layout memory means connected to the processor means for storing layout coordinates resulting from normalization of the circuit layout by the processor means wherein all cell interconnections are defined by abutment from which the processor means extracts data relating to the interconnections and relative placements between cells contained in the normalized circuit layout:
   interface graph memory connected to the processor means for storing interface graph representations of normalized layout cells as determined by the processor means from the stored layout coordinates of the normalized circuit layout:
   primitive loop memory means connected to the processor means for receiving and storing data generated by the processor means from the interface graph representations stored in the interface graph memory means relating to relationships between the relative placements of a plurality of cells contained in the normalized circuit layout;
   intracell constraint memory means connected to the processor means for storing a list of design rule constraints related to electrical interaction and geometrical spacing relationships between elements within the cells;
   intercell constraint memory means connected to the processor means for storing constraints describing abutment relationships across interfaces between cells for preserving abutment and design rule enforcement across cell boundaries; and
   compacted coordinate memory means for storing compacted coordinates resulting from solving a minimized set of constraints stored in the primitive loop memory means, the intracell constraint memory means, and the intercell constraint memory means, by the processor in accordance with executed program instructions stored in the program memory means.

5. A computer implemented method for compacting the geometrical area of an integrated circuit layout by removing geometrical regularities in the circuit layout, wherein the method comprises the steps:

defining the circuit layout by a system of equations;

factoring the equations into classes, each class of equation representing a type of constraint applied to the circuit layout;

minimizing the equations of each class into a minimum set of equations;

simultaneously solving the minimum set of equations; and recreating the circuit layout in compacted form from solutions to the minimum set of equations.

6. The method of claim 5, wherein the step of factoring the equations into classes comprises factoring the equations into at least three independent classes including primitive loop constraint equations, intracell constraint equations and intercell constraint equations.

* * * * *